(12) United States Patent
Gohlke et al.

(10) Patent No.: US 7,256,504 B2
(45) Date of Patent: Aug. 14, 2007

(54) CIRCUIT SUPPORT FOR A SEMICONDUCTOR CHIP AND COMPONENT

(75) Inventors: Silvia Gohlke, Allershausen (DE);
Thomas Münch, Laaber (DE)

(73) Assignee: Siemens Aktiengesellschaft, Munich (DE)

( * ) Notice: Subject to any disclaimer, the term of this patent is extended or adjusted under 35 U.S.C. 154(b) by 144 days.

(21) Appl. No.: 11/099,823

(22) Filed: Apr. 6, 2005

(65) Prior Publication Data

US 2005/0218529 A1    Oct. 6, 2005

(30) Foreign Application Priority Data

Apr. 6, 2004    (DE) .................. 10 2004 016 940

(51) Int. Cl.
*H01L 23/48* (2006.01)
(52) U.S. Cl. ............ 257/783; 257/786; 257/E23.04; 438/118
(58) Field of Classification Search ............ 257/701, 257/730, 783, E23.04
See application file for complete search history.

(56) References Cited

U.S. PATENT DOCUMENTS

| | | | |
|---|---|---|---|
| 6,204,555 B1 | 3/2001 | Iovdalsky | |
| 6,818,538 B2 * | 11/2004 | Chiang et al. | 438/611 |
| 2001/0050422 A1 * | 12/2001 | Kishimoto et al. | 257/678 |
| 2004/0212083 A1 * | 10/2004 | Yang | 257/723 |
| 2005/0263861 A1 * | 12/2005 | Ahn et al. | 257/666 |

FOREIGN PATENT DOCUMENTS

| | | |
|---|---|---|
| JP | 03-064056 A | 3/1991 |
| JP | 06-342817 A | 12/1994 |
| JP | 10-163407 A | 6/1998 |

* cited by examiner

*Primary Examiner*—Leonardo Andujar
*Assistant Examiner*—Krista Soderholm
(74) *Attorney, Agent, or Firm*—Laurence A. Greenberg; Werner H. Stemer; Ralph E. Locher

(57) ABSTRACT

A circuit support for a semiconductor chip with a substrate made of an insulating material has a chip mounting area and a plurality of bonding pads surrounding the chip mounting area. The chip can be applied in a central area of the chip mounting area. A peripheral area surrounding the central area defines the border of the chip mounting area and it is of a far greater length than a length of the lateral edges of the chip to be mounted.

15 Claims, 5 Drawing Sheets

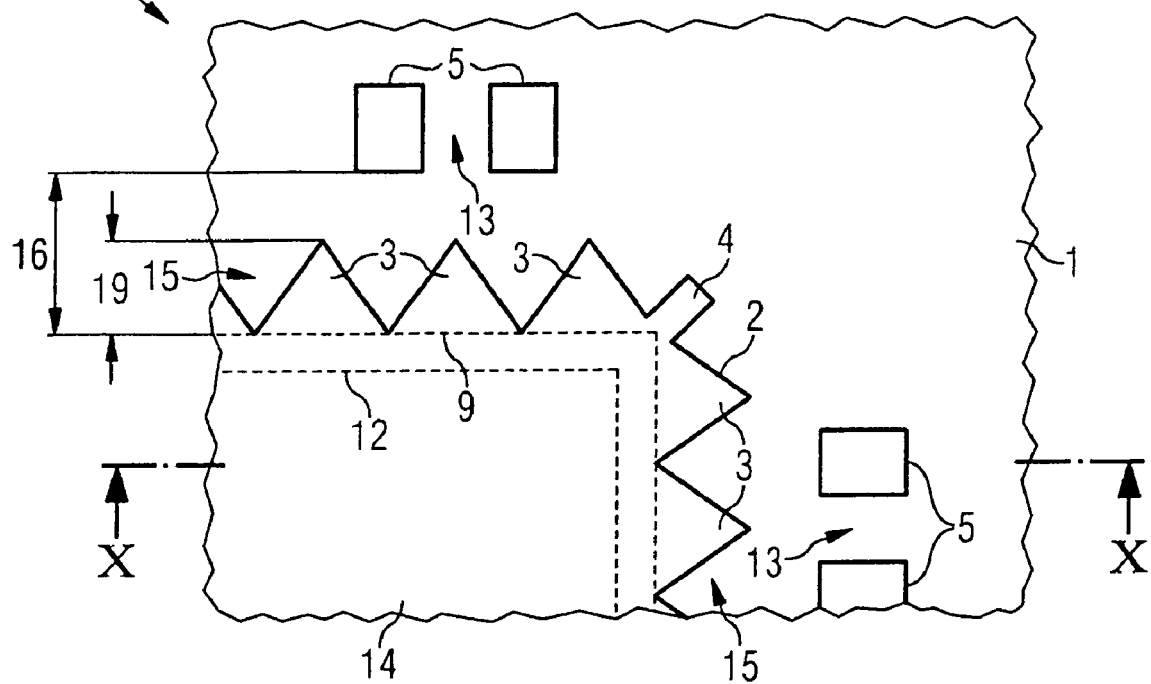
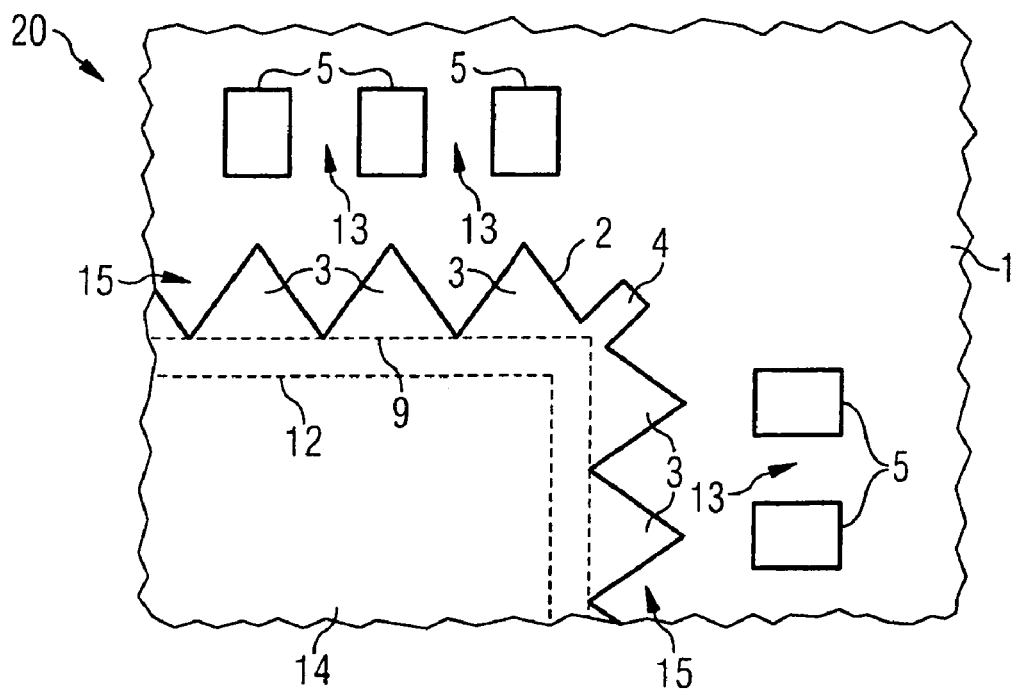

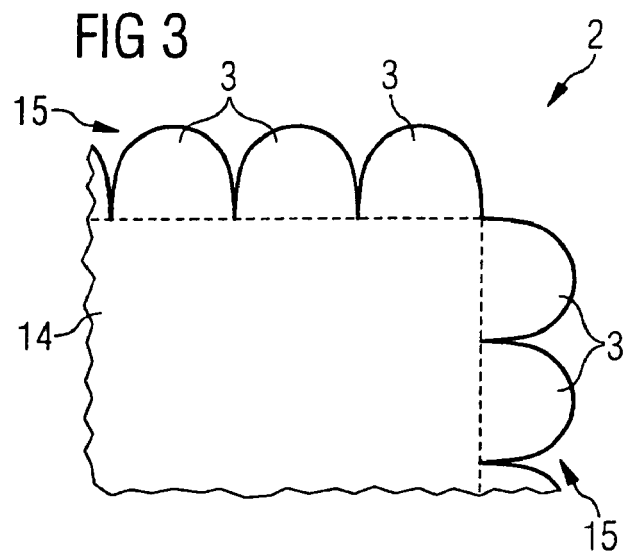
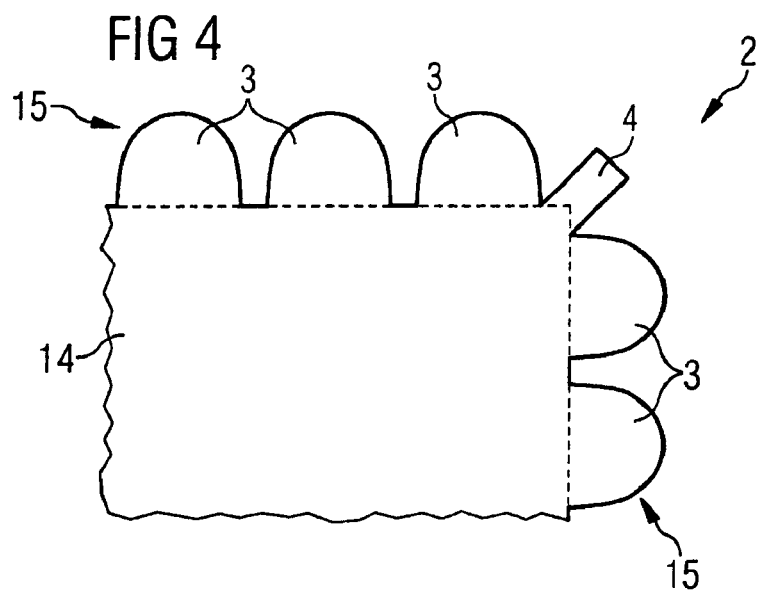
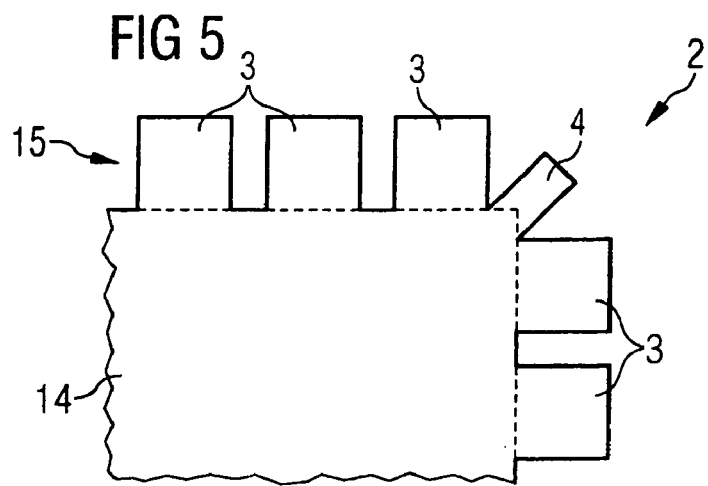

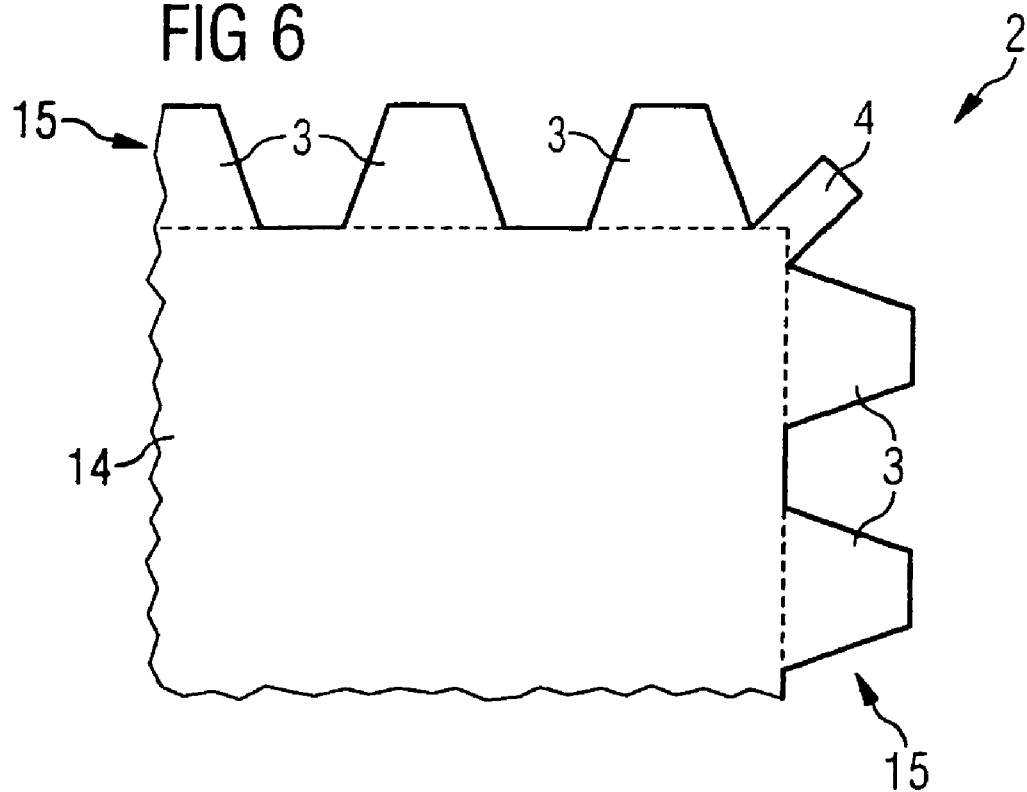
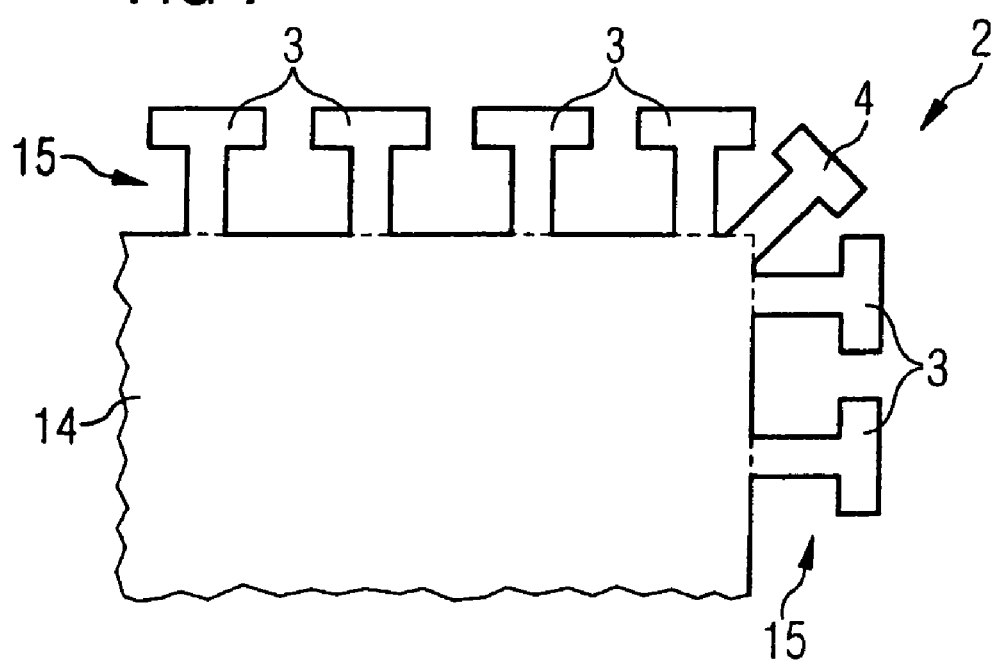

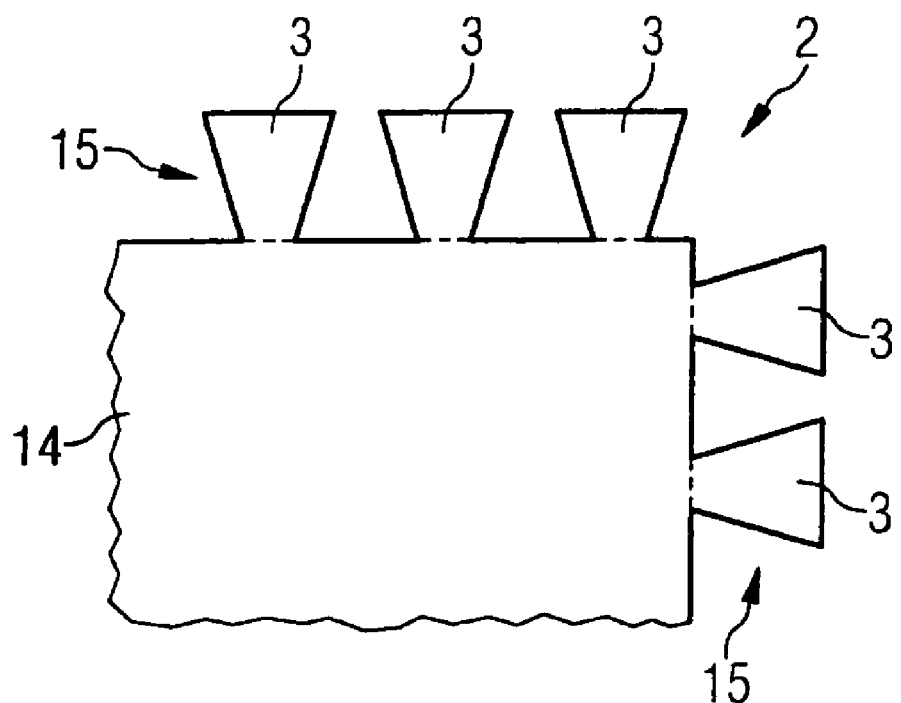
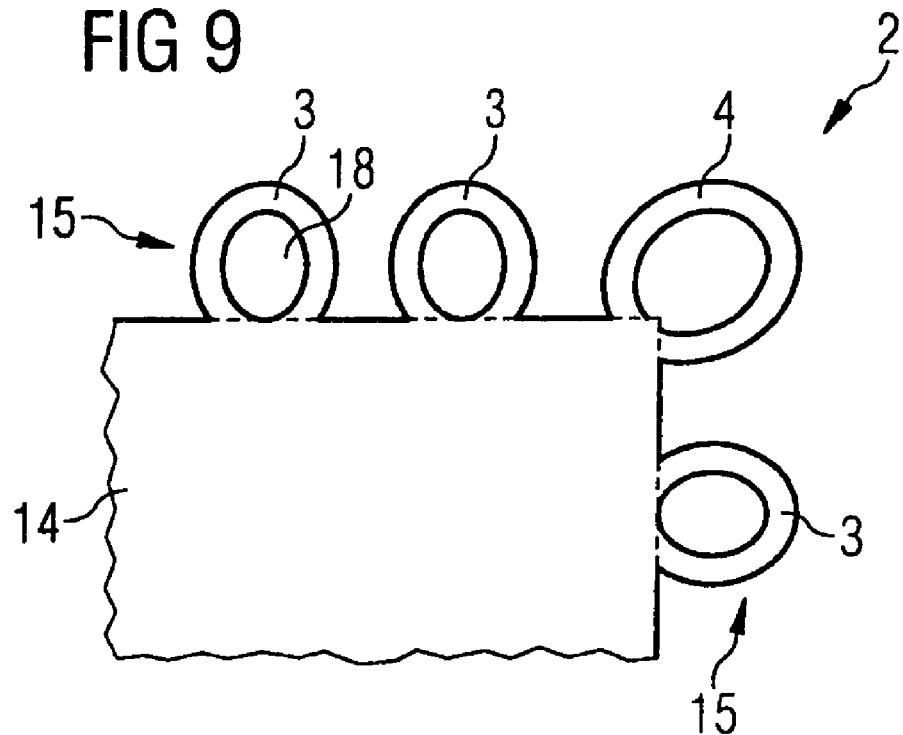

CIRCUIT SUPPORT FOR A SEMICONDUCTOR CHIP AND COMPONENT

BACKGROUND OF THE INVENTION

Field of the Invention

The invention relates to a circuit support for a semiconductor chip with a substrate made from an insulating material on which a chip mounting area and a plurality of bonding pads surrounding the chip mounting area are disposed. The invention further relates to a component with a circuit support and a semiconductor chip.

The chip mounting area serves to accommodate and retain a semiconductor chip (chip). The size of the chip mounting area generally matches the size of the semiconductor chip. In other words, the semiconductor chip is no bigger than the chip mounting area. The outer edges of the semiconductor chip and the chip mounting area are either flush with one another or run approximately parallel (provided the chip is smaller than the chip mounting area). The electrical connection between chip connectors on one of the principal surfaces of the semiconductor chip facing away from the substrate and a corresponding bonding pad takes place by means of bonding wires, this connection being made after the semiconductor chip has been applied and fixed to the chip mounting surface.

It is becoming increasingly common to use electrically conductive bonding agents, such as for example adhesives, instead of the solder frequently used in the past, to fix the semiconductor chip on the chip mounting area. These agents contain at least one resin component enriched with fillers. During the curing of the bonding agent involving the use of an adapted temperature profile, the filler-enriched resin system separates. In this process, the bonding agent becomes runny and begins to develop liquid characteristics.

In order to ensure that the semiconductor chip is firmly affixed to the landing area, the bonding agent needs to protrude slightly from at least three lateral edges of the semiconductor chip. This criterion is monitored during the manufacturing process by a visual inspection. As the lateral edge of the semiconductor chip and the boundary of the chip mounting area generally approximately correspond, it is possible for the bonding agent, which is heated to a high temperature during the curing process, to flow onto the substrate. This can give rise to the undesirable situation in which the bonding agent can "splash" the bonding pads that are set apart from the chip mounting area. Bonding pads that have been dirtied or "contaminated" in this way, however, no longer permit a reliable bonding connection to be achieved without additional, expensive cleaning processes.

The problem described above can be reduced, but not entirely avoided, by means of a sufficiently large space between the bonding pads and the chip mounting area to which the adhesive has been applied. This also presents the undesirable drawback that the surface area requirement of the circuit support increases. This would result in an increase in the unit cost of the component.

To avoid contamination of the bonding pads, occasional attempts are made during manufacture to apply the adhesive using a sieve or stencil. Reducing the quantity of adhesive, which is frequently applied to the chip mounting area by means of an extrusion process, can in certain circumstances result in a critical shortfall in quantity as a result of which inclusions and shrink holes can be formed between the semiconductor chip and the chip mounting area causing the overall reliability of the component to be adversely affected when in operation.

In order to prevent bonding pads from being contaminated by a bonding agent, Japanese published patent application JP 06342817 A proposes arranging a frame surrounding the chip mounting area between the chip mounting area and the bonding pads with the bonding wires extending beyond the frame.

U.S. Pat. No. 6,204,555 suggests countersinking the chip into a recess in the substrate such that the bonding pads on the chip and the bonding pads on the substrate are situated on a plateau. The chip is fixed to the substrate within the recess thus ensuring that no bonding agent can reach the surface of the substrate and thus its' bonding pads.

Japanese published patent application JP 03064056 A proposes surrounding the chip mounting area with a cut-out which is arranged deeper than the bonding pads. Any bonding agent escaping from the confines of the chip mounting area would flow into the channel and be contained therein. A similar configuration is described in Japanese published patent application JP 10163407 A in which the mounting area is surrounded by a raised surface, which stops any outflow of bonding agent.

All these approaches that are known from the prior art are disadvantageous in that the manufacture of a circuit support for a semiconductor chip has to be modified in relation to the known techniques.

SUMMARY OF THE INVENTION

It is accordingly an object of the invention to provide a mount for a semiconductor chip as well as a component with a semiconductor chip and a circuit support which overcome the above-mentioned disadvantages of the heretofore-known devices and methods of this general type.

With the foregoing and other objects in view there is provided, in accordance with the invention, a circuit support for a semiconductor chip having lateral edges with a given length, the circuit support comprising:

a substrate formed of an insulating material;

a chip mounting area on the substrate, the chip mounting area having a central area for mounting the semiconductor chip thereon, and a peripheral area surrounding the central area and defining a boundary of the chip mounting area with edges of the chip mounting area;

a plurality of bonding pads surrounding the chip mounting area;

wherein, relative to the given length of the lateral edges of the chip to be mounted on the central area, the boundary of the chip mounting area has a length enabling a formation of adhesive forces preventing a bonding agent from flowing over the edges of the chip mounting area towards the bonding pads.

With the circuit support according to the invention, the semiconductor chip can be accommodated in a central area of the chip mounting area whereby the chip mounting area comprises a border area surrounding the central area, the border area defining the border of the chip mounting area which is of such a length, in comparison to that of the lateral edges of the chip to be mounted, so as to enable the formation of adhesive forces that prevent a bonding agent from flowing beyond the edges of the chip mounting area towards the bonding pads.

In other words, this means that the previously very geometrically linear external contour of the chip mounting area is modified in such a way that the length of the external contour is increased many times over and can thus be used to form adhesive forces. The adhesive forces between the liquid material of the adhesive and the material of the chip mounting area are used to stop the flow front components of the adhesive during the curing process. By increasing the available effective length of the border of the chip mounting area, it is possible to reduce the frontal expansion of the liquid components of the adhesive as a result of the latter being slowed by the influence of lateral adhesive forces.

To this end, the concept behind the invention is to provide geometrically shaped peripheral structure elements on the border of the chip mounting area. The peripheral structure elements thereby form part of the chip mounting area i.e. preferably they are of one piece connected with the latter and are manufactured along with it and are again preferably made of the same material as the central area of the chip mounting area. The configuration of the peripheral structure elements is fundamentally of lesser importance in this provided the latter create a boundary the length of which far exceeds that of the edges of the chips to be mounted and that of the adhesive flow fronts that these chips define and produce.

It is expedient for the central area of the chip mounting area to be defined such that the former is more or less the same size as the chip i.e. the boundary of the lateral edges of the chip with the peripheral structure elements arranged along at least one of the edges. The shape and dimensions of the central area thus correspond to the known shape of the chip mounting area which is now modified and enlarged by the peripheral structure elements provided in the border area.

To enlarge the boundary yet further, it is preferable for peripheral structure elements to be arranged at the corners of the central area. It is useful for the peripheral structure elements and/or the peripheral structure corner elements to be in the shape of a polygon or a "T", or to be curved.

In accordance with a further embodiment of the invention, the peripheral structure elements and/or the peripheral structure corner elements feature at least one opening. This is advantageous in that the boundary is not just enlarged by the external edges facing the bonding pads but that a boundary is also formed "within" the chip mounting area. This means that no damage is caused if components of the adhesive penetrate through the opening onto the substrate as these components are not able to flow towards the bonding pads and contaminate them.

According to a further embodiment of the invention, two peripheral structure elements and/or one peripheral structure element and a peripheral structure corner element are arranged apart from one another. Alternatively, provision is made for two peripheral structure elements and/or one peripheral structure element and a peripheral structure corner element to be arranged such that they border one another. Which of these arrangements should be preferred can be made contingent upon the bonding agent used and its flow characteristics during the curing phase. The configuration can thus be optimized with a view to the overall length of the boundary to be achieved.

According to one expedient embodiment, a peripheral structure element is arranged opposite the bonding pads. Alternatively, provision is made for the bonding pads to be positioned on the substrate with a space between them such that a space is formed between each neighboring pair of bonding pads and a peripheral structure element is located opposite one of the spaces. In this case the choice can also be dependent on which adhesive is used and on what materials the chip mounting area has been made from, as the flow characteristics of the adhesive as it hardens are essentially dependent on these two factors.

The same applies to a further preferred embodiment according to which the peripheral structure elements extend no more than 25-50% of the distance from the edge of the central area towards the bonding pads.

The component according to the invention features a semiconductor chip, which is mounted on a circuit support in the manner described above. The component concerned by this invention offers the same advantages as those described in connection with the circuit support.

An adhesive is preferably used as a bonding agent for fixing the semiconductor chip to the chip mounting area, said adhesive having at least one resin component and at least one filler, the adhesive qualities of which are achieved following a curing process.

Other features which are considered as characteristic for the invention are set forth in the appended claims.

Although the invention is illustrated and described herein as embodied in a circuit support for a semiconductor chip and component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a partial top view of a portion of a circuit support according to the invention in which the peripheral structure elements are arranged opposite a space between two bonding pads;

FIG. 2 is a partial top view of a portion of the circuit support according to the invention in which peripheral structure elements are each arranged opposite a bonding pad;

FIGS. 3-9 are partial plan views showing various exemplary embodiments of chip mounting areas for a circuit support in accordance with this invention in which the boundary is very much longer than the length of the edges of a semiconductor chip to be mounted on the board;

DESCRIPTION OF THE PREFERRED EMBODIMENTS

Figure 11:
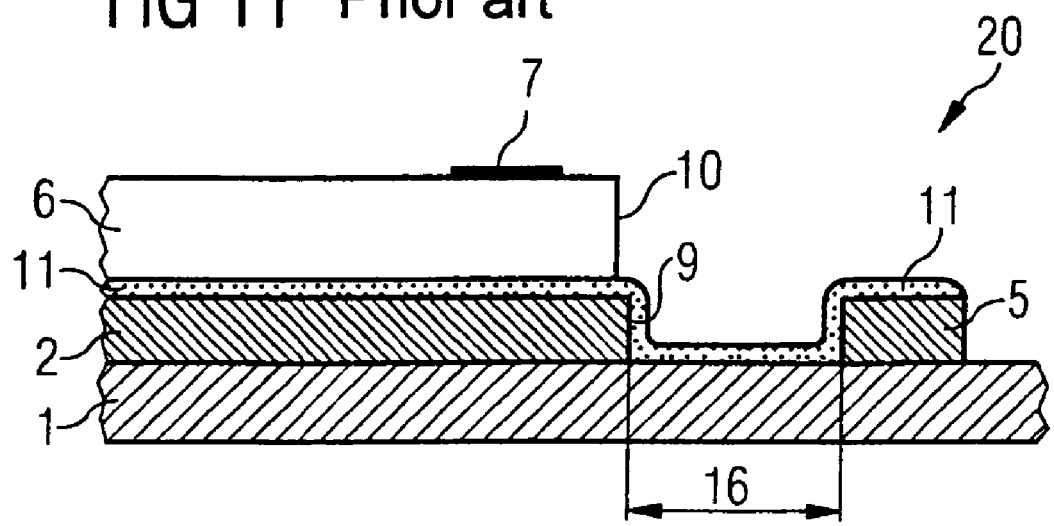
FIG. 11 is a cross-section through a section of a circuit support representing the prior art.

Referring now to the figures of the drawing in detail and first, particularly, to the prior art illustration in FIG. 11, there is a circuit support 20. The assembly represents the prior art and the problem it gives rise to. A chip mounting area 2 and a bonding pad 5, separated by a spacing distance 16, are arranged on a substrate 1 made from a nonconductive material, such as, for example, a ceramic. A semiconductor chip 6 is mounted and fixed to the chip mounting area 2 by means of a bonding agent 11. The chip 6 features a chip connector surface 7 on its principal surface facing away from the substrate 1, which is to be connected via a bonding wire with the bonding pad 5.

Applying and fixing the chip 6 to the chip mounting area 2 is carried out, for example, by impressing the bonding agent 11 to the chip mounting area during which the bonding agent 11 is initially distanced from its edge 9. When the chip 6 is applied to the bonding agent 11, the latter is pushed towards the edge 9. A visual inspection monitors whether the bonding agent 11 can be observed on at least three lateral edges of the semiconductor chip 6 as only components meeting this criterion are considered flawless. This is then followed by the curing of the bonding agent 11 represented for example in the form of an adhesive with at least one resin component and one filler.

During the curing process, associated with the application of a temperature profile adapted to the bonding agent, the filler(s) and resin component(s) separate whereby the latter turns (turn) into a liquid and is (are) able to flow over the edge 9 onto the surface of the substrate 1 and unfavorably onto the bonding pad 5. A bonding pad 5 which is dirtied or contaminated in this way no longer permits a reliable bonding connection so that components like these are rejected or require reworking. The flow of the bonding material 11 over the edge 9 can be caused by an excess dose of the bonding agent such that during curing the adhesive forces are no longer sufficient to keep the bonding agent at the edge 9.

The invention therefore provides for shaping the boundary of the chip mounting area 2 such that it is made many times larger than the prior art. This can be seen more clearly from FIGS. 1 to 9.

Figure 10:
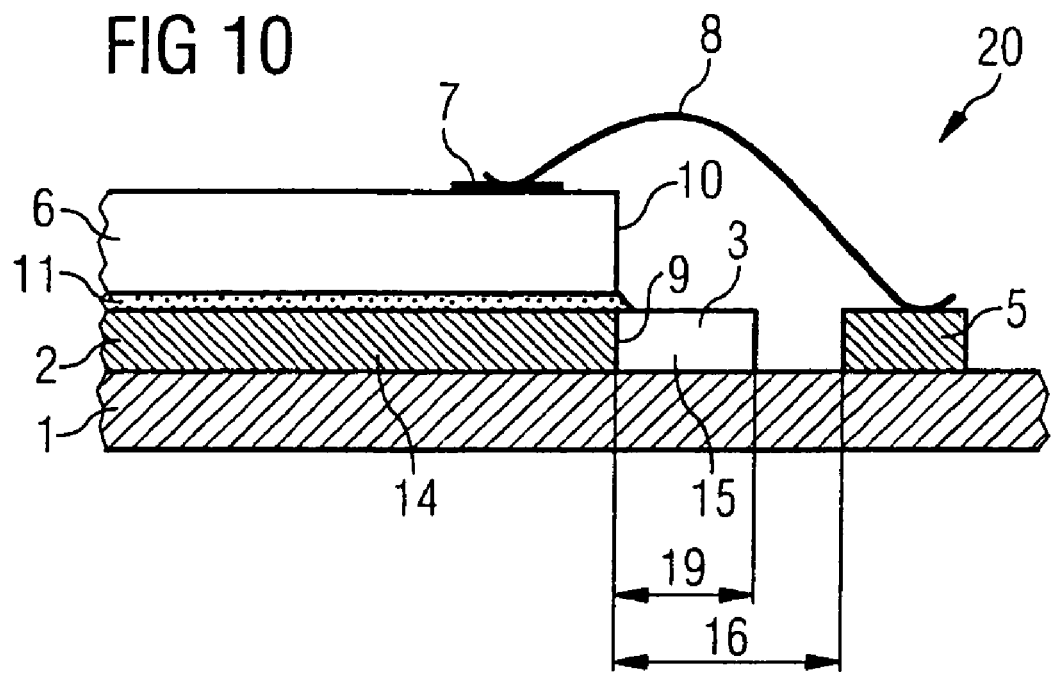
FIG. 10 is a cross-section taken along the line X-X through the circuit support of FIG. 1.

FIG. 1 shows a top view of a section of a circuit support 20 according to this invention, FIG. 10 shows a cross-section through this circuit support along the line X-X. The chip mounting area 2 comprises a central area 14 and a peripheral area 15 in which a plurality of the peripheral structure elements 3 and a peripheral structure corner element 4 are provided. In terms of its size and dimensions, the central area 14 corresponds to the chip mounting area known from the prior art for a chip of a given area. Its size is represented by the dashed line characterized with the reference character 9. The bonding agent 11 is applied to the central area 14 to a bonding agent borderline 12, also represented by a dashed line.

Increasing the length of the boundary is achieved solely by the peripheral structure elements 3 and peripheral structure corner elements 4 located in the peripheral area 15. In this way the peripheral area 15 of the chip mounting area 2 extends within the space 16 formed between the bonding pads 5 and the central area 14 and has a width of 19. Advantageously the ratio of width 19 and space 16 lies in the range from 1 to 4 to 1 to 2 i.e. the width 19 amounts to between 25 and 50% of the space 16. The choice of the suitable value principally depends on the materials of the chip mounting area and of the bonding material, which influence the liquid characteristics during the curing process.

The illustration of the cross-section along the line X-X in FIG. 1 shows the difference with the prior art particularly clearly. The peripheral area 15 extends within the space 16 formed between the bonding pad 5 and the central area 14 (defined by the edge 9). This increase in the length of the boundary is sufficient to prevent the adhesive from flowing towards the bonding pads during the curing process as the adhesive forces along the edges of the chip mounting area are now able to prevent such a flow. This ensures that a reliable electrical connection between the terminal surface 7 and the bonding pad 5 can be achieved by means of a bonding wire.

Simply "extending" the chip mounting area into the peripheral area using a linear boundary, on the other hand, would not be able to stop the flow front as the adhesive forces would not be sufficiently great. Instead—depending on the material from which the chip mounting area was made—the spread of the liquid bonding agent could be accelerated so that at least a partial contamination of the bonding pads would be caused as a result of the smaller distance between the bonding pad and the chip mounting area.

An arrangement is shown in the exemplary embodiment in FIG. 1, in which the peripheral structure elements 3 comprise the shape of a triangle. The vertices of these triangles point to a space 13 formed between each pair of 2 neighboring bonding pads.

In contrast, FIG. 2 shows the vertices of the peripheral structure elements 3, also in the form of a triangle, arranged opposite the bonding pads 5. Which of the two arrangements is chosen depends chiefly on the adhesive used to fix the semiconductor chip 6 as well as on the material of the chip mounting area 2, since both these components determine the liquid characteristics of the adhesive during the curing process.

FIGS. 3 to 9 respectively show a top view of sections of different chip mounting areas as they could be provided on a substrate.

In FIG. 3 the peripheral structure elements 3 have a curved shape and adjoin one another. FIG. 4 also shows peripheral structure elements 3 with a curved shape arranged at a distance from one another. A peripheral structure element 4 at the corner of the central area 14 is also designed. FIG. 5 shows right angled peripheral structure elements 3 distanced from one another with a right angled peripheral structure element 4. In FIG. 6, the peripheral structure elements 3 are distanced from one another and are trapezoidal in shape, and an essentially right angled peripheral structure corner element 4 is provided. In the exemplary embodiment in FIG. 7, the peripheral structure elements 3 and the peripheral structure corner element 4 are in the form of a "T". FIG. 8 shows peripheral structure elements 3 in the form of a trapezoid with their short lateral edges facing the central area 14. Finally, FIG. 9 shows peripheral structure elements each of which features an opening 18 thus resulting in a bow shape. The openings 18 do not just extend the boundary of the chip mounting area 2 but also act as reservoirs for adhesive that overflows the edges 9 during the curing process.

The exemplary embodiments illustrated in FIGS. 3 to 9 can be optionally arranged opposite the bonding pads or opposite the spaces formed between two bonding pads. Each of the exemplary embodiments can optionally be provided with a peripheral structure corner element 4 or not, independent of what is illustrated in the Figures. In principle, the peripheral structure corner element can be any shape. In addition to the right angled shape shown, the geometry could also comprise the fractal peripheral structure. This application claims the priority, under 35 U.S.C. § 119, of German patent application No. 102004016940.3, filed Apr. 6, 2004; the entire disclosure of the prior application is herewith incorporated by reference.

We claim:

1. A circuit support for a semiconductor chip having lateral edges with a given length, the circuit support comprising:
   a substrate formed of an insulating material;
   a chip mounting area on said substrate, said chip mounting area having a central area for mounting the semiconductor chip thereon, and a peripheral area surrounding said central area and defining a boundary of said chip mounting area with edges of said chip mounting area, said boundary being defined by a plurality of geometrically-shape peripheral structure elements;

a plurality of bonding pads surrounding said chip mounting area;

wherein, relative to the given length of the lateral edges of the chip to be mounted on said central area, said boundary of said chip mounting area has a length enabling a formation of adhesive forces preventing a bonding agent from flowing over said edges of said chip mounting area towards said bonding pads.

2. The circuit support according to claim 1, wherein said central area is defined by edges approximately matched to a course of the lateral edges of the chip and said peripheral structure elements are disposed along at least one of said edges.

3. The circuit support according to claim 1, which comprises peripheral structure corner elements disposed at corners of said central area.

4. The circuit support according to claim 3, wherein at least one of said peripheral structure elements and said peripheral structure corner elements have a shape of a polygon, a "T" shape, or a curved shape.

5. The circuit support according to claim 3, wherein said peripheral structure corner elements have a shape of one of a polygon, a "T" shape, or a curved shape.

6. The circuit support according to claim 3, wherein at least one of said peripheral structure elements and said peripheral structure corner elements are formed with an opening in said peripheral structure elements.

7. The circuit support according to claim 1, wherein two peripheral structure elements and/or a peripheral structure element and a peripheral structure corner element are disposed with a spacing distance from one another.

8. The circuit support according to claim 1, wherein two peripheral structure elements and/or a peripheral structure element and a peripheral structure corner element are disposed adjoining one another.

9. The circuit support according to claim 1, wherein a peripheral structure element is disposed opposite one of said bonding pads.

10. The circuit support according to claim 1, wherein said bonding pads are disposed on said substrate with a spacing distance from one another, forming a space between two mutually adjacent bonding pads, and wherein a peripheral structure element is disposed opposite said space.

11. The circuit support according to claim 1, wherein said bonding pads are disposed at a spacing distance from an edge of said central area and said peripheral structure elements exhibit a maximum extension of 25-50% of a distance from said edge in a direction toward said bonding pad.

12. A component, comprising a circuit support according to claim 1, and a semiconductor chip disposed on said chip mounting area of the circuit support.

13. The component according to claim 10, which further comprises an adhesive forming a bonding agent for fixing said semiconductor chip, said adhesive including at least one resin component and at least one filler.

14. The circuit support according to claim 1, wherein said chip mounting area is provided as a single layer.

15. The circuit support according to claim 1, wherein said plurality of geometrically-shaped peripheral structure elements are continuously connected to one another.

* * * * *